United States Patent [19]

Yang et al.

[11] Patent Number: 5,019,878

[45] Date of Patent: May 28, 1991

[54] PROGRAMMABLE INTERCONNECT OR CELL USING SILICIDED MOS TRANSISTORS

[75] Inventors: Ping Yang, Richardson; Amitava Chatterjee, Dallas; Shian Aur, Plano; Thomas L. Polgreen, Dallas, all of Tex.

[73] Assignee: Texas Instruments Incorporated, Dallas, Tex.

[21] Appl. No.: 332,652

[22] Filed: Mar. 31, 1989

[51] Int. Cl.⁵ .................................... H01L 29/10
[52] U.S. Cl. ......................... 357/23.3; 357/23.12; 357/72; 365/104; 365/182
[58] Field of Search ................ 357/23.12, 23.3; 365/104, 182, 72

[56] References Cited

U.S. PATENT DOCUMENTS

| | | | |
|---|---|---|---|
| 4,467,520 | 8/1984 | Shiotari | 357/23.12 |
| 4,507,757 | 3/1985 | McElroy | 365/104 |
| 4,819,043 | 4/1989 | Yazawa et al. | 357/23.12 |
| 4,837,181 | 6/1989 | Galbiati et al. | 365/104 |
| 4,847,808 | 7/1989 | Kobatake | 365/104 |

OTHER PUBLICATIONS

Minato et al., "High Performance 4k Dynamic RAM Fabricated with Short Channel MOS Technology," 1978, Japanese Journal of Applied Physics, vol. 17, Supplement 17-1, pp. 65-69.

Primary Examiner—Andrew J. James
Assistant Examiner—Courtney A. Bowers
Attorney, Agent, or Firm—Melvin Sharp; James T. Comfort; Richard A. Stoltz

[57] ABSTRACT

A programmable device (10) is formed from a silicided MOS transistor. The transistor 10) is formed at a face of a semiconductor layer (12), and includes a diffused drain region (17, 22) and a source region (19, 24) that are spaced apart by a channel region (26). At least the drain region (22) has a surface with a silicided layer (28) formed on a portion thereof. The application of a programming voltage in the range of ten to fifteen volts from the drain region (17, 22) to the source region (19, 24) has been discovered to reliably form a melt filament (40) across the channel region (26). A gate voltage ($V_g$) may be applied to the insulated gate (14) over the channel region (26) such that a ten-volt programming voltage ($V_{PROG}$) will cause melt filaments to form in those transistors to which the gate voltage is applied, but will not cause melt filaments to form in the remaining transistors (10) of an array.

10 Claims, 2 Drawing Sheets

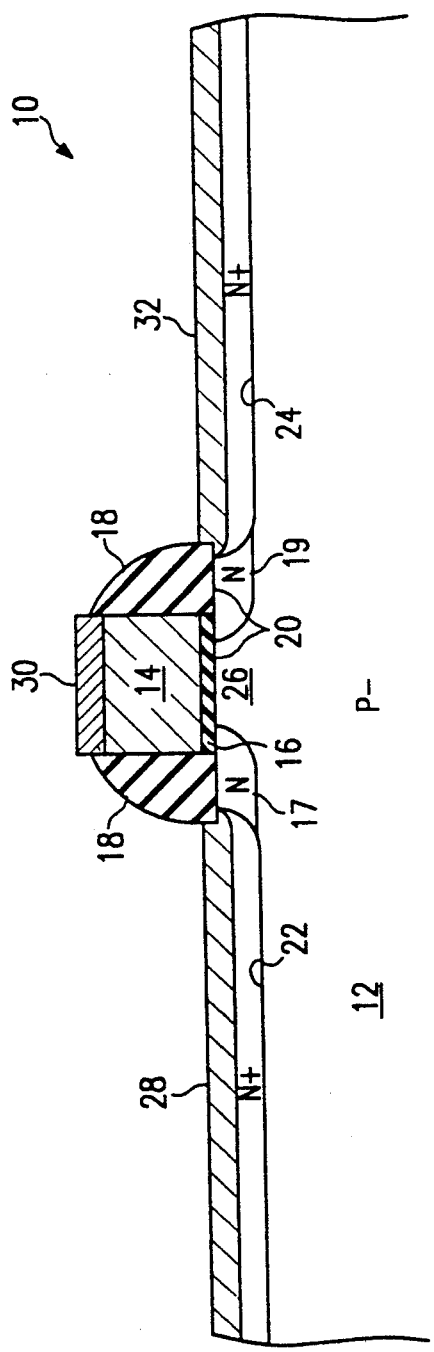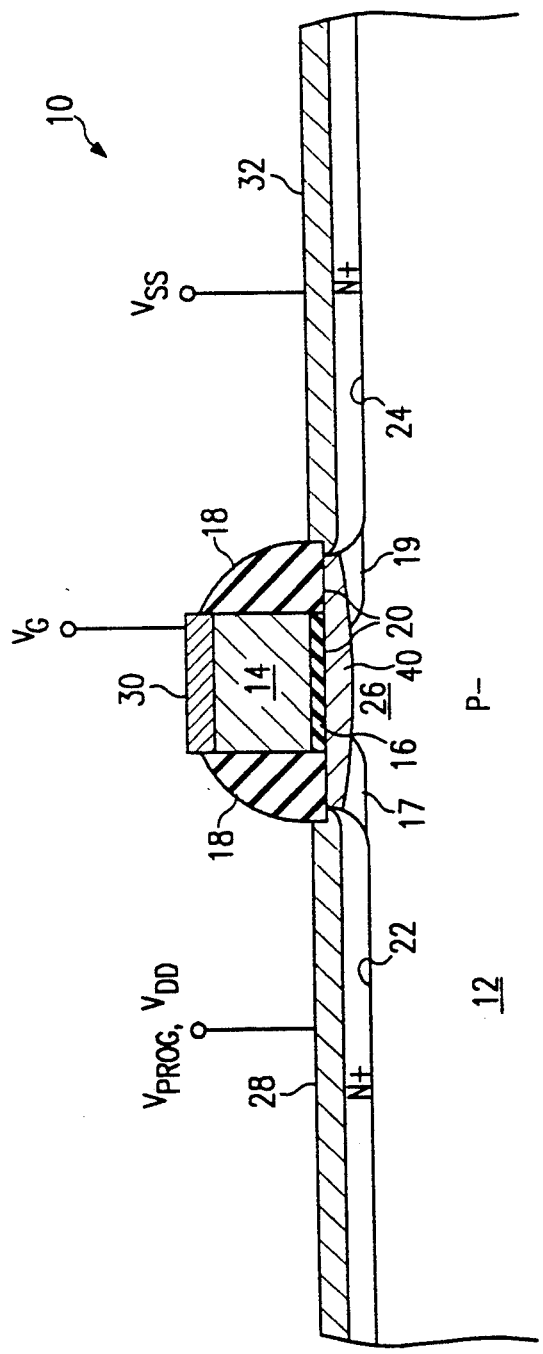

PROGRAMMABLE INTERCONNECT OR CELL USING SILICIDED MOS TRANSISTORS

TECHNICAL FIELD OF THE INVENTION

This invention relates in general to programmable interconnect or cell devices formed in semiconductors and in particular to a programmable interconnect or cell device having at least one silicide-clad diffusion.

BACKGROUND OF THE INVENTION

As the semiconductor industry has advanced, the search for smaller chips has resulted in many experiments with various structural configurations utilizing an array of materials. Unfortunately, not all of these experiments have been fruitful. For example, as the demand for higher current has increased, so has the degree of failure in the semiconductor due to structural meltdowns and inadvertent electrical shorts. In fact, the degree of drain-to-source shorts has been studied extensively, and predictable results of such drain-to-source shorts have been summarized in scientific periodicals. See Aur, S., "Hot-Electron Reliability and ESD Latent Damage," *IEEE Transactions on Electron Devices*, Vol. 35, No. 12, Dec., 1988.

Many people have successfully designed around the problem that caused semiconductors to have drain-to-source shorts. Despite the presence of this commonly recurring drain-to-source short problem in the industry, no one has taken advantage of the predictability of such shorts. Instead, this drain-to-source short problem has been uniformly viewed as an industry thorn.

The present invention realizes that silicided MOS transistors which have a predictable drain-to-source shorting characteristic can be used as programmable interconnects to electrically program circuits after fabrication.

SUMMARY OF THE INVENTION

One aspect of the invention comprises a programmable device formed at a face of a semiconductor layer having a first conductivity type. A source region and a drain region are formed at the face, both to be of a second conductivity type. The source and drain region are spaced by a channel region of the first conductivity type. A conductive layer is formed at least on the drain region. The device is programmable by applying a programming voltage greater than or equal to the drain-source breakdown voltage between the drain region and the source region to form a conductive filament in the channel region that couples the drain region to the source region.

It is preferred that conductive layers be formed on both the source and drain regions, and further that the conductive layer be formed from a metal silicide or other metal-semiconductor compound. In the preferred embodiment, the application of the programming voltage causes a filament to extend from the drain silicide layer to the source silicide layer. A preferred metal for the silicide compound used in the device is titanium.

In another aspect of the invention, it has been found that the programming voltage required varies with the bias voltage applied to an insulated gate of the device. Where a bias voltage exceeding the threshold voltage of the device is applied to the gate, and the length of the channel region is less than one micron, the programming voltage has been determined to be less than or equal to about ten volts. However, this same programming voltage when applied to devices that do not have the gate bias voltage applied thereto, will not cause formation of the filament. This characteristic can be used in selectively programming field effect transistors in an array by connecting a switched programming source to the drain region of each of the transistors, connecting the source regions thereof to a source voltage such as zero volts, selectively applying a gate voltage to those transistors desired to be programmed, and then applying the programming voltage.

The present invention confers a technical advantage in that it provides a programmable element that can be used as an interconnect device or as a memory element in an array. The device of the invention has an advantage over conventional fuses and antifuses in that the element as programmed has a resistance only of about ten ohms, as compared to the higher resistance of antifuses which must melt through oxide or some other dielectric material.

BRIEF DESCRIPTION OF THE DRAWINGS

The novel features of this invention's structure, operation and advantages will be best understood from the accompanying drawings, taken in conjunction with the accompanying description, in which similar reference characters refer to similar parts, and in which:

FIG. 1 is a highly magnified schematic cross-sectional view of a programmable device according to the invention;

FIG. 2 is a cross-sectional view generally similar to FIG. 1, showing electrical connections thereto and the formation of a filament after a predetermined programming voltage has been applied to the drain region.

DETAILED DESCRIPTION OF THE INVENTION

Figure 3:
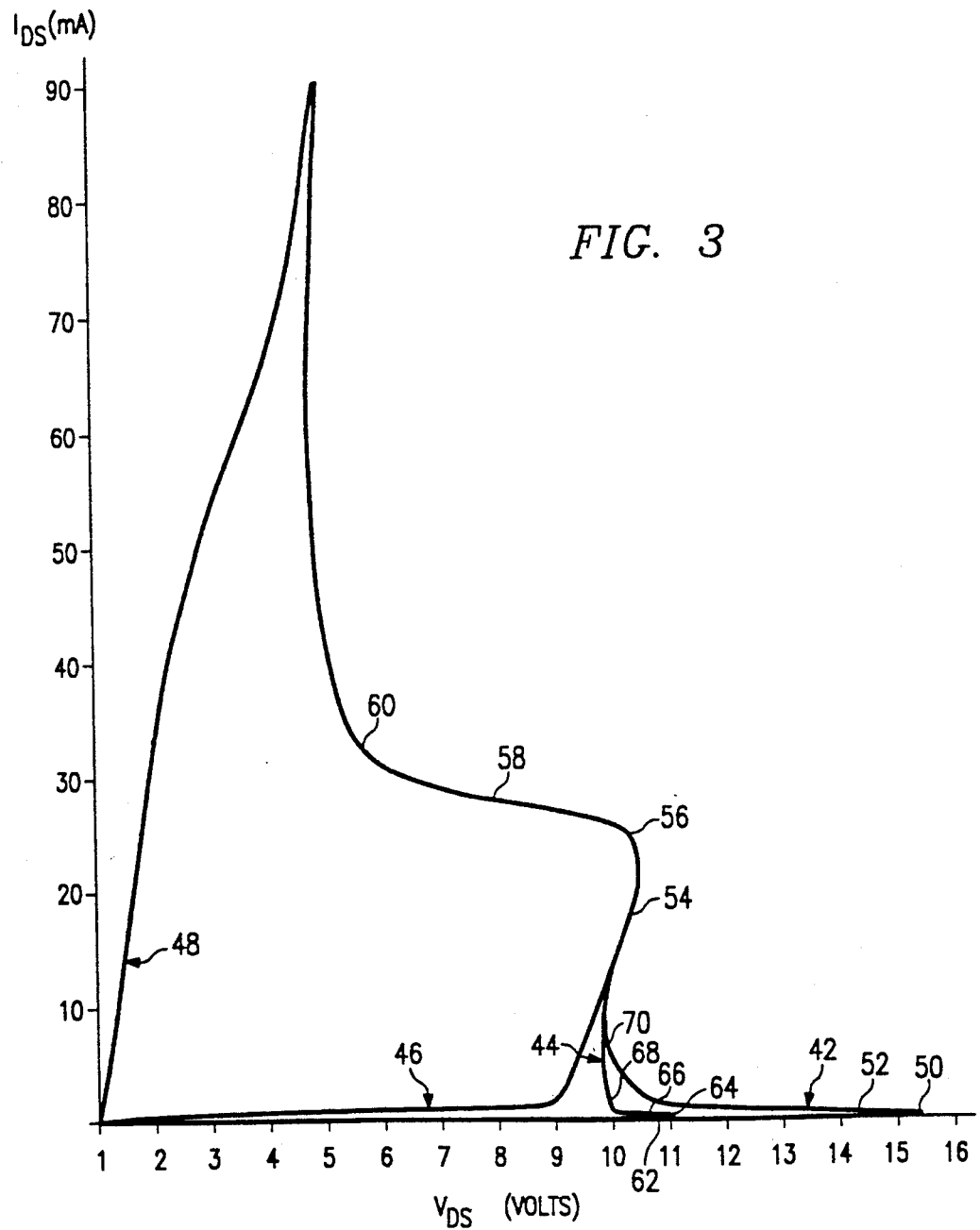
FIG. 3 is a graph of drain to source current versus drain to source voltage illustrating the effect of applying a predetermined programming voltage to the drain region under various gate bias conditions.

Referring initially to FIG. 1, a programmable interconnect device is shown in an enlarged, schematic cross-sectional view, and is generally designated 10. Device 10 preferably is built on a (p-)silicon substrate 12. Other materials may be substituted for silicon substrate 12, including semiconductor layers or substrates made out of other semiconductors such as gallium arsenide. The conductivity types may in an alternative embodiment be reversed, although this will affect the programming and bias voltage ranges.

The device 10 is in essence a silicided insulated-gate field-effect transistor. The construction of such transistors is well known in the art, but will briefly be reviewed here.

A gate oxide layer (not shown) is grown across the face of the preferably silicon substrate or layer 12. This oxide layer (not shown) can instead be any other thin insulator of good reliability, such as nitride. A gate layer (not shown) is next deposited. This gate layer may be highly doped polycrystalline silicon or may consist of any other conductive material.

A photoresist layer (not shown) or other patterning structure is next applied to the outer surface of the gate layer and developed. Using this pattern, a gate conductor 14 and a gate insulator 16 are formed by selectively etching away the gate oxide layer and gate layer elsewhere.

An n-type dopant is next lightly implanted into the substrate 12 using the gate 14 as a self-aligned mask. This creates a lightly-doped drain region 17 and a lightly-doped source region 19.

Next, a thick layer of field oxide (not shown) is deposited across the surface of the substrate and over the gate conductor 14 and the gate oxide 16. This field oxide is anisotropically etched to leave sidewall oxide portions 18.

The workpiece is now ready for a second self-aligned implantation step. An (n) dopant is shallowly implanted at a high concentration into surface 20 of the semiconductor layer 12 in order to create a relatively heavily doped (n+) drain region 22 and a relatively heavily doped (n+) source region 24. The thickness of the drain regions 17 and 22 and the source regions 19 and 24 may be chosen as approximately 250 angstroms. A channel region 26 is defined by the implantation of the (n) regions 17 and 19. The length of this channel region is preferably one micron or less. Its width in a direction perpendicular to the length is preferably relatively long, such as 10 to 25 microns.

After the implantation step, the workpiece is subjected to a siliciding agent, such as one containing titanium, in a nitrogen atmosphere. This causes the formation of titanium silicide layers 28, 30 and 32 whereever elemental silicon is exposed to the process. A titanium nitride layer (not shown) is deposited on other surfaces such as the sidewall outside portions 18. This titanium nitride, together with all titanium not reacted with the silicon, is subsequently sintered away to leave the structure as shown. Although not shown, the structure may be completed by depositing a thick layer of field oxide over the completed transistor 10, and opening contacts in it to the silicided regions 28, 30 and 32. Aluminum or another suitable metal or other conductive material is then deposited in these contacts.

The programming operation of device 20 may be understood by referring to FIG. 2. A programming voltage source $V_{PROG}$ is applied to silicide layer 28 and therefore also to region 22. This programming voltage $V_{PROG}$ is preselected to be greater than or equal to the source-drain breakdown voltage of the transistor 10. $V_{PROG}$ is preferably in the range of approximately 10 and approximately 15 volts, and more preferably is about 10 volts.

While the programming voltage $V_{PROG}$ is applied to the drain region 22, a bias voltage $V_G$ is applied to the silicided layer 30 and therefore to the gate 14. This bias voltage should be greater than the operating threshold voltage of the transistor 10, and is preferably about five volts. The voltage range of ten to fifteen volts for $V_{PROG}$ and the gate voltage of five volts are given for a channel length of less than or equal to one micron, and may be greater than this for increased channel lengths.

In response to the application of the programming voltage and the gate voltage, the titanium silicide 28 on the drain region will become fluid and will migrate under the influence of $V_{PROG}$ toward the source region 24, eventually connecting to the titanium silicide layer 32. A filament 40 is thereby formed that is usually no deeper than approximately 250 angstroms from the surface 20 of the silicon layer 12. The shape and positioning of the filament 40 in FIG. 2 are entirely schematic. $V_{PROG}$ is selected such that the filament 40 reliably forms from the silicide layer 28 to the silicide layer 32, but yet does not degrade the drain/substrate or source/substrate pn junctions. A source voltage $V_{ss}$ is applied to the source region 24. In the illustrated embodiment, $V_{ss}$ is chosen to be zero volts. Other voltages than the ones shown may be applied, so long as the difference between $V_{PROG}$ and $V_{ss}$ is ten to fifteen volts for the geometry given.

After programming, the resistance between the drain region 22 and source region 24 is reduced to approximately ten ohms. This phenomenon has been observed consistently in devices from different fabrication lines. In experimentation, the short is typically a five -micron wide melt filament between the two regions. Additionally, it has been measured that in devices such as device 10, as having $TiSi_2$ on (n+) diffusions and the poly gate 30, have a programming threshold current density of approximately three mA/um for transistors having 10-micron-wide channel regions 26 and 2 mA/um for transistors with 25-micron-wide channel regions 26.

While the illustrated embodiment shows titanium silicide areas 28 and 32, other conductors may be substituted. For example, other siliciding metals may be used in the place of titanium, such as platinum or tungsten. Alternatively, a non-siliciding metal may be used that would then be deposited directly on the diffused regions 22 and 24. Such a non-siliciding metal could, for example, be aluminum, gold, copper or silver. The melt filament 40 would then of course be composed of the metal selected.

Referring now to FIG. 3, a plot of the drain-source current $I_{DS}$ versus the drain-source voltage $V_{DS}$ is shown for four devices 10 (FIG. 2). Curves 42, 44 and 46 are graphs of the voltage-current snap-back curves that occur under different values of $V_G$. A curve 48 is a curve of a device 10 that has already been programmed.

In order to produce curves 42-46, a programming voltage was gradually increased from zero volts up to the breakdown voltage by 0.2 volt increments in 250 nanosecond pulses. Curve 42 was produced when the gate voltage $V_g$ was set at zero volts. Essentially no current flowed from the drain 22 to the source 24 up to a point 50 at 14.4 volts, at which point voltage breakdown and filament formation began to occur. Once point 50 is obtained, a rapid snap back to the essentially conductive relation shown in curve 48 occurs in three phases. A first segment 52 is observed during which time $V_{DS}$ decreases to approximately 9.8 volts and $I_{DS}$ increases to about 13 milliamps. Thereafter, the current steeply increases along a segment 54 until a second shoulder is reached at a point 56. This point is approximately 10 volts at which point the $I_{DS}$ is approximately 25 milliamps. A segment 58 is then seen during which time the drain/source voltage quickly drops off to about five volts at point 60. Thereafter, the current once again increases steeply as a function of the increasing $V_{PROG}$ voltage until the curve 42 and the curve 48 are essentially congruent.

Curve 44 is a plot of the voltage-current relation during the programming of a device 10 (FIG. 2) when one volt is selected for $V_G$. At the beginning, an essentially flat, non-conductive curve segment 62 is seen, terminating at approximately eleven volts at point 64. The voltage recedes while the current increases during a segment 66 until a point 68 is reached. Thereafter, the current increases swiftly during a segment 70 until the curve 44 becomes essentially congruent with the curve 42 before the shoulder 56 is reached. The snap back curve after this point is essentially the same as where $V_G$ equals zero volts.

Curve 46 results when $V_G$ is chosen as two volts, which is above the threshold voltage of the device 10. Curve 46 increases slowly until approximately nine volts is reached, at which point the current shoots up dramatically, essentially conforming to curves 54 and 70 in this respect. The snap back curve after the shoulder 56 is reached is similar to the other two cases.

From the above, it can be seen that it is advantageous to bias the gate with a voltage above the operating threshold of the transistor in order to avoid a large breakdown voltage. A programming voltage can therefore be chosen as about ten volts, thereby defending against pn junction breakdown in the device 10.

Curves 42, 44 and 46 suggest a method for programming an array of devices 10. Referring briefly back to FIG. 2, consider a plurality of devices 10 wherein each of the drain regions 22 is connected to a switched $V_{PROG}$ source while each of the source regions 24 is connected to $V_{SS}$ or ground. $V_G$ may however be selectively applied to different ones of the transistors. Where $V_G$ is chosen to be at least two volts, and more preferably five volts, a $V_{PROG}$ may be chosen, such as at about ten volts, that will selectively program only those transistors to which the $V_G$ has been applied. In these transistors, a filament 40 will be formed, while in the remaining transistors it will not. The device is thus useful for selective programming an array of cells such as memory cells for the storage of "one" or "zero" bits. For instance, a word line may be connected to the drain 22, and a bit line may be connected to the source region 24. A subsequent reading voltage may be impressed on the word line, and may be fixed at five volts. The presence or absence of current appearing on the bit line will give a logic "one" or a logic "zero" result thereon.

There are several advantages of using this drain to source breakdown of the silicided transistors. As can be appreciated, the cost effectiveness and the ease of manufacturing exceed many of the commonly used techniques such as laser fabrication.

In alternate embodiments, multiple schemes for programming the drain to source short can be developed since the minimum requirements for filament formation depend on only few parameters, i.e. the transistor width and the channel length. Thus, a current pulse to the transistor may be shortened by proper selection of the width and length of the channel.

While the particular programmable device 10 as herein shown and disclosed in detail is fully capable of obtaining the objects and providing the advantages herein before stated, it is to be understood that it is merely illustrative of the presently preferred embodiments of the invention, and that no limitations are intended to the details of construction or design herein shown other than as defined in the appended claims.

What is claimed is:

1. A method for selectively programming a field-effect transistor having a drain region formed in a semiconductor layer and a conductive layer formed adjacent said drain region, comprising the steps of:
    applying a programming voltage between said drain region and a source region spaced from the drain region, the programming voltage being greater than or equal to the source-drain breakdown voltage of the transistor; and
    in response to said step of applying the programming voltage, forming a conductive filament between the drain region and the source region.

2. The method of claim 1, wherein a conductive layer is formed adjacent said source region of said field-effect transistor, said step of forming the conductive filament comprising forming the filament from the conductive layer adjacent the drain region to the conductive layer adjacent the source region.

3. The method of claim 2, wherein said step of forming the conductive filament further includes reducing the source-drain resistance of the field-effect transistor to about ten ohms.

4. The method of claim 1, wherein a length of a channel region in said semiconductor layer spacing said drain region from said source region is less than or equal to one micron, said step of applying the programming voltage comprising applying a voltage in the range of ten to fifteen volts.

5. The method of claim 4, wherein said channel region has a width perpendicular to said length of approximately ten microns, said step of applying a programming voltage further comprising the step of transmitting a current from the drain region to the source region having a current density greater than or equal to three milliamps per micron of width.

6. The method of claim 4, wherein said step of applying a programming voltage further comprises applying the programming voltage as a pulse having a duration of approximately 250 nanoseconds.

7. The method of claim 4, wherein said channel region has a width perpendicular to said length of approximately 25 microns, said step of applying a programming voltage further comprising the step of transmitting a programming current between said drain region and said source region having a current density of approximately two milliamps per micron of channel width.

8. The method of claim 1, and further comprising the step of applying a bias voltage to an insulated gate of said field effect transistor which is greater than or equal to a threshold voltage of said field effect transistor during said step of applying the programming voltage.

9. A method for selectively programming an array of field-effect transistors, each having a drain region formed in a semiconductor layer and a conductive layer formed adjacent said drain region, comprising the steps of:
    applying a gate voltage to insulated gates of selected ones of the transistors, the gate voltage being greater than or equal to the threshold voltage of the transistors;
    connecting the drain regions of each of the transistors to a switched source of programming voltage;
    connecting a source region of each of the transistors to a source voltage, the difference between the source voltage and the programming voltage selected as greater or equal to the source-drain breakdown voltage of the transistors when said transistors have had said gate voltage applied thereto;
    applying the programming voltage to the drain regions; and
    in response to said step of applying the programming voltage and the gate voltage, forming conductive filaments between the respective drain regions and the respective source regions of the selected ones of the transistors.

10. The method of claim 9, wherein said step of applying the gate voltage comprises applying a gate voltage of five volts.

* * * * *